United States Patent
Liu et al.

(10) Patent No.: US 10,586,879 B2
(45) Date of Patent: Mar. 10, 2020

(54) SPECTRALLY SELECTIVE SOLAR ABSORBING COATING AND A METHOD FOR MAKING IT

(71) Applicant: CHINA BUILDING MATERIALS ACADEMY, Chaoyang District Beijing (CN)

(72) Inventors: Jing Liu, Beijing (CN); Zhiqiang Sun, Beijing (CN); Zhongzhou Yang, Beijing (CN); Hong Wang, Beijing (CN)

(73) Assignee: CHINA BUILDING MATERIALS ACADEMY, Chaoyang District Beijing (CN)

( * ) Notice: Subject to any disclaimer, the term of this patent is extended or adjusted under 35 U.S.C. 154(b) by 124 days.

(21) Appl. No.: 15/563,710

(22) PCT Filed: Jan. 20, 2016

(86) PCT No.: PCT/CN2016/071428
§ 371 (c)(1),
(2) Date: Oct. 2, 2017

(87) PCT Pub. No.: WO2016/155407
PCT Pub. Date: Oct. 6, 2016

(65) Prior Publication Data
US 2018/0076342 A1    Mar. 15, 2018

(30) Foreign Application Priority Data

Apr. 3, 2015    (CN) .......................... 2015 1 0158664
Sep. 1, 2015    (CN) .......................... 2015 1 0550161

(51) Int. Cl.
*G06K 7/10* (2006.01)
*H01L 31/0216* (2014.01)
(Continued)

(52) U.S. Cl.
CPC .......... *H01L 31/02168* (2013.01); *B32B 9/00* (2013.01); *B32B 9/041* (2013.01);
(Continued)

(58) Field of Classification Search
CPC ..... F24J 2/48; F24J 70/20; F24J 70/30; C23C 14/35; C23C 14/08; C23C 14/06;
(Continued)

(56) References Cited

U.S. PATENT DOCUMENTS 4,127,102 A    11/1978  Berman
2012/0172148 A1    7/2012  Freeman
(Continued)

FOREIGN PATENT DOCUMENTS

CN    101093115 A    12/2007
CN    201121999 Y    9/2008
(Continued)

OTHER PUBLICATIONS

Notification of First Office Action for Chinese Application No. 201510550161.2 dated Nov. 10, 2016.
(Continued)

*Primary Examiner* — Jade R Chwasz
*Assistant Examiner* — Jyotsna V Dabbi
(74) *Attorney, Agent, or Firm* — Meunier Carlin & Curfman LLC

(57) ABSTRACT

A spectrally selective solar absorbing coating includes a multilayer stack including, from the substrate to the air interface: substrate (1), infrared reflective layer (2), barrier layer (3), composite absorbing layer (4) consisting of metal absorbing sublayer (4.1), metal nitride absorbing sublayer (4.2), and metal oxynitride absorbing sublayer (4.3), and antireflective layer (5). Therefore, the solar absorbing coating has good high and low temperature cycle stability and superior spectrum selectivity, with a steep transition zone
(Continued)

A sectional view of a spectrally selective solar absorbing coating between solar absorption and infrared reflection zones. It has a relatively high absorptance α>95%, and a low thermal emissivity ε ≤4%, PC (performance criterion) =−0.3. The solar absorbing multilayer stack can be obtained by reactively magnetron sputtering the metal target in argon or other inert gas with some amounts of gas containing oxygen or nitrogen or their combination.

18 Claims, 3 Drawing Sheets

(51) Int. Cl.
| | | |
|---|---|---|
| *C23C 14/06* | (2006.01) | |
| *C23C 28/00* | (2006.01) | |
| *F24S 70/20* | (2018.01) | |
| *B32B 15/18* | (2006.01) | |
| *B32B 15/04* | (2006.01) | |
| *B32B 9/00* | (2006.01) | |
| *F24S 70/30* | (2018.01) | |
| *B32B 9/04* | (2006.01) | |
| *B32B 15/20* | (2006.01) | |
| *C03C 17/36* | (2006.01) | |
| *C01B 33/12* | (2006.01) | |
| *C01G 37/02* | (2006.01) | |

(52) U.S. Cl.
CPC ............ *B32B 15/04* (2013.01); *B32B 15/043* (2013.01); *B32B 15/18* (2013.01); *B32B 15/20* (2013.01); *C03C 17/366* (2013.01); *C03C 17/3626* (2013.01); *C03C 17/3649* (2013.01); *C23C 14/0641* (2013.01); *C23C 14/0676* (2013.01); *C23C 28/322* (2013.01); *C23C 28/34* (2013.01); *C23C 28/345* (2013.01); *F24S 70/20* (2018.05); *F24S 70/30* (2018.05); *B32B 2255/06* (2013.01); *B32B 2307/40* (2013.01); *B32B 2307/416* (2013.01); *B32B 2307/418* (2013.01); *B32B 2307/50* (2013.01); *B32B 2307/732* (2013.01); *C01B 33/12* (2013.01); *C01G 37/02* (2013.01); *Y02E 10/40* (2013.01)

(58) Field of Classification Search
CPC . C23C 14/14; C23C 14/0641; C23C 14/0676; C23C 28/322; C23C 28/34; C23C 28/345; H01L 31/02168; C03C 17/3626; C03C 17/3649; C03C 17/366; B32B 15/04; B32B 15/043; B32B 15/18; B32B 15/20; B32B 33/00; B32B 9/00; B32B 9/041; B32B 2255/06; B32B 2307/40; B32B 2307/416; B32B 2307/418; B32B 2307/50; B32B 2307/732; C01B 33/12; C01G 37/02; Y02E 10/40
USPC .......................................................... 359/350
See application file for complete search history.

(56) References Cited

U.S. PATENT DOCUMENTS

| | | | |
|---|---|---|---|
| 2012/0224256 A1* | 9/2012 | Dasbach | B23K 26/18 359/350 |
| 2013/0125876 A1 | 5/2013 | Andritschky et al. | |
| 2015/0140355 A1* | 5/2015 | Suzuki | B32B 7/02 428/623 |

FOREIGN PATENT DOCUMENTS

| | | | | |
|---|---|---|---|---|
| CN | 202083144 U | 12/2011 | | |
| CN | 102538261 A | 7/2012 | | |
| CN | 102620456 | 8/2012 | | |
| CN | 202388851 | 8/2012 | | |
| CN | 202388851 U | 8/2012 | | |
| CN | 102734956 A | 10/2012 | | |
| CN | 103032977 A | 4/2013 | | |
| CN | 103162452 | 6/2013 | | |
| CN | 103471426 A | 12/2013 | | |
| CN | 103512208 A | 1/2014 | | |
| CN | 105091377 | * | 7/2014 | ............... F24J 2/48 |
| CN | 104034071 A | 9/2014 | | |
| CN | 104034073 A | 9/2014 | | |
| CN | 104048431 A | 9/2014 | | |
| CN | 104279780 A | 1/2015 | | |
| CN | 204535163 U | 8/2015 | | |
| WO | 2009051595 A1 | 4/2009 | | |

OTHER PUBLICATIONS

Translation of Chinese Office Action issued in CN20151058664.5, dated Dec. 2, 2016.

* cited by examiner

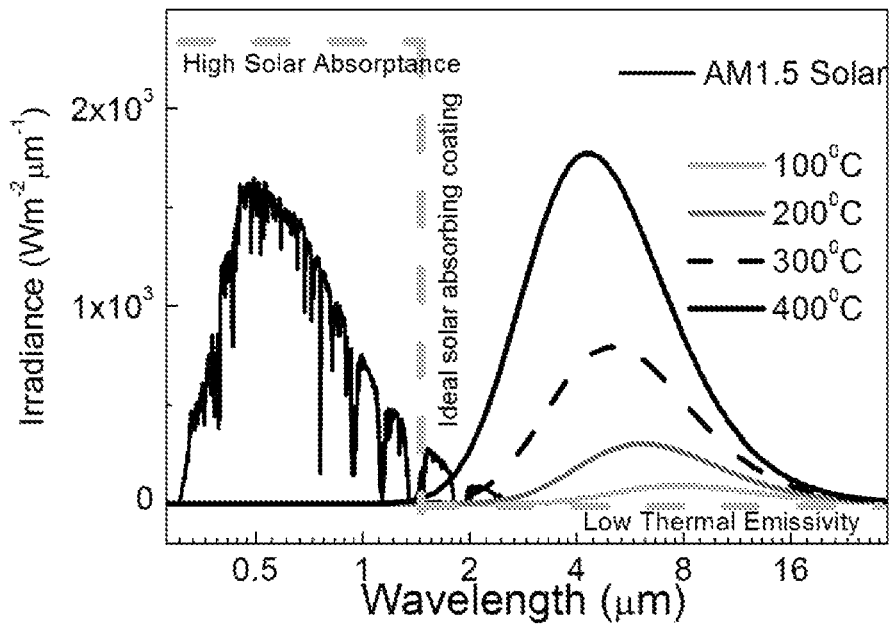
Fig.1 Spectral performance of an ideal spectrally selective solar absorbing coating
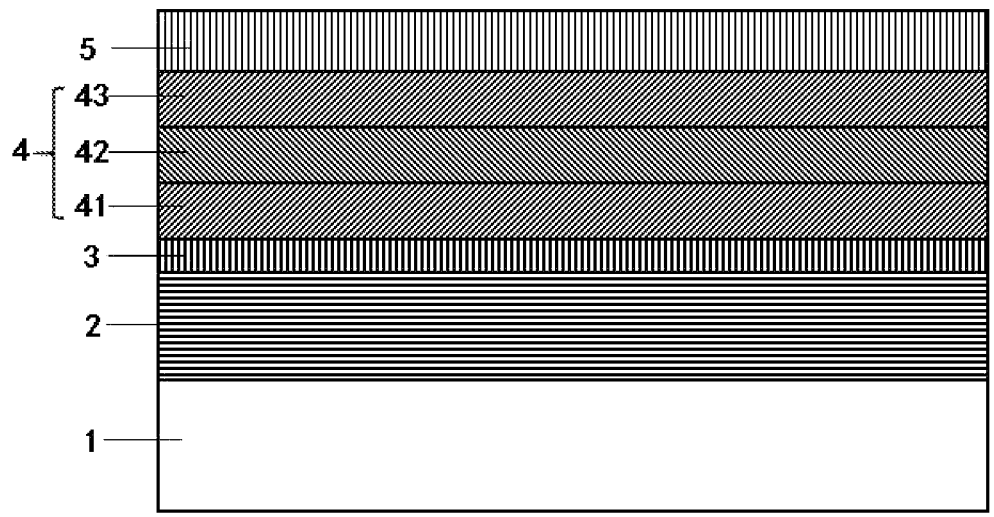
Fig.2. A sectional view of a spectrally selective solar absorbing coating

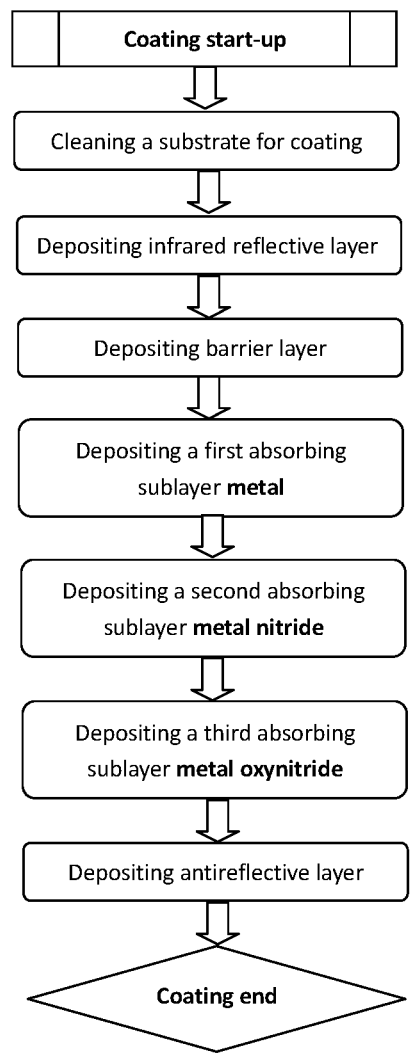
Fig.3. An exemplary flowchart of the preparation method for the solar absorbing coating

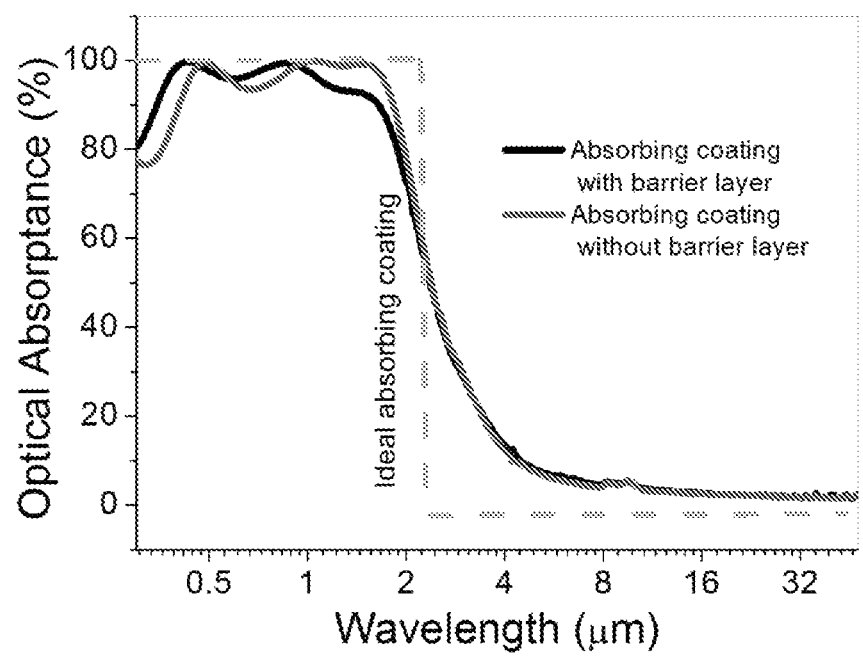
Fig.4 Absorbing spectra of the solar absorbing coating with and without barrier layer in the present invention

SPECTRALLY SELECTIVE SOLAR ABSORBING COATING AND A METHOD FOR MAKING IT

CROSS REFERENCE TO RELATED APPLICATIONS

This application is a 371 U.S. National Phase of International Application No. PCT/CN2016/071428, filed Jan. 20, 2016, which claims the benefit of priority to Chinese application Nos. 201510158664.5, filed Apr. 3, 2015, and 201510550161.2, filed Sep. 1, 2015, which are each incorporated by reference herein in their entireties.

FIELD

The invention involves a spectrally selective solar absorbing coating and a method for making it.

DESCRIPTION OF THE RELATED ART

Spectrally selective solar absorbing coating is a key material in solar energy collector. In order to obtain the high solar-thermal conversion efficiency, the solar absorbing coating should absorb much of the incident solar energy (in the wavelength from 0.3 µm to 2.5 µm) while losing very little heat by re-radiation (at wavelength greater than 2.5 µm). Specifically, solar absorptance ($\alpha$) is defined as the relationship between the solar energy absorbed by the coating relative to that which reaches the surface of the coating, and thermal emissivity ($\varepsilon$) is defined as the relationship between the energy emitted by the coating at an operating temperature relative to the energy emitted by an ideal black body at the same temperature. Given all of the above, the absorbing coating should be designed to have $\alpha$ as high as possible and $\varepsilon$ as low as possible, as shown in FIG. 1. Additionally, the coating with most abrupt transition between the solar and IR spectrums is required. And $\varepsilon$ is particularly significant in applications at high temperatures, considering that the emission losses increase with the fourth power of the absolute temperature.

A solar absorbing coating may consist in a simple black organic paint, a monolithic metallic or ceramic coating, or a multilayered optical stack. Multilayered solar absorbing coating commonly comprises different thin films having different optical characteristics sequentially deposited on metal or glass substrates, i.e. bottom infrared reflective layer, solar absorbing layer, and surface antireflective (AR) layer. Compared with the previous two types, the multilayered stack is more practical because it offers a high degree of flexibility to optimize the solar selectivity and achieves the best optical performance.

A variety of techniques, such as electroplating, anodization, inorganic pigmentation of anodized aluminum, chemical vapor deposition (CVD), and physical vapor deposition (PVD), can produce the above various solar absorbing coatings. And magnetron sputtering is a more practical PVD coating technology, because it is not only a green non-pollution coating technology but also suitable for large-scale production.

Presently, one of mainly commercially introduced solar absorbing multilayer stack consists of at least two TiNxOy absorbing layers with different x, y values, and SiOx AR layer, and is claimed to achieve the values of $\alpha$>95% and $\varepsilon$<5% with a maximum operation temperature of up to 200° C. There are some other multilayer stacks with very similar coating compositions, replacing titanium in the above mentioned TiNxOy by aluminium, chromium, niobium, and a composition of aluminium and titanium (AlTi), and the performance of these coatings does not improve.

In order to extend the operation temperature and the lifetime of the above-mentioned solar absorbing coating, an absorbing coating with absorbing layers having mixed components absorbing materials is known from U.S. Pat. No. 2013/0125876 A1. The first absorbing layer comprises titanium, aluminium, nitrogen, and one of following elements: silicon, yttrium, cerium, and chromium. The second absorbing layer comprises titanium, aluminium, nitrogen, oxygen and one of following elements: silicon, yttrium, cerium, and chromium. The top layer has a composition including titanium, aluminium, silicon nitrogen, and oxygen.

The solar absorbing coatings based on above-mentioned various multicomponent oxynitrides are usually coated by magnetron sputtering from a target with a composition similar to the composition of the layer to be deposited or by simultaneous sputtering from the multiple pure element targets in a reactive atmosphere containing nitrogen or oxygen. In a reactive sputtering, a chemical reaction takes place between the metal and the reactive gas to produce a nitride or oxynitride of the transition metal or alloy. Extent of the reaction must be controlled precisely by adjusting the partial pressure of the reactive gas within the chamber. A minor change in partial pressure of the reactive gas could cause the obvious change in solar absorptance, thermal emissivity, and even surface color of coating, therefore, they have to be controlled precisely in order to obtain the desirable optical selectivity. For large area applications, there are disadvantages such as complex coating process and high demands of accuracy and stability of coating equipment control.

The degradation of the solar absorbing coatings consisting of metal oxynitrides generally causes by three basic processes. Firstly, Oxygen or other corrosive elements from the atmosphere corrode the top layer of the coatings, and permeate towards the following absorbing layers, generally resulting in a reduction of $\alpha$ and an increase of $\varepsilon$. Secondly, elements diffusion between the bottom infrared reflective layer and absorbing layer causes again the degradation. Thirdly, during the lifetime of a solar absorbing coating, such coating is exposed to numerous thermal cycles which may cause delamination or peel-off of coatings that result in a complete failure of a solar energy collector having coating.

For practical purposes, a selective absorbing coating should have not only fore-mentioned good optical properties, but also good thermal stability at its working temperature, low cost and ease of large-scale production.

Keeping these considerations in view, in the present invention a selective absorbing coating and its reactive magnetron sputtering methods are proposed.

SUMMARY OF THE INVENTION

An object of the present invention is to provide an efficient solar absorbing coating, with a high solar absorptance and most importantly, a low thermal emissivity. Its characteristics are: 1. The coating has excellent spectral selectivity, and can be operated at temperature of 80° C.-250° C. 2. The absorbing layer consists of three absorbing sublayers, which are metal, metal nitride, and metal oxynitride in the order from bottom IR reflective layer to top AR layer. This triple-layer composite absorbing layer makes it possible for the coating to have not only high ratio $\alpha/\varepsilon$, but also good coating adhesion strength and high thermal circle stability. 3. The method of the present invention has simple coating processing, low equipment requirement and high deposition rate, making it suitable for large-scale, low-cost production.

To achieve the above mentioned advantages and in accordance with the purpose of the present invention, as embodied and broadly described, the present invention provides a spectrally selective solar absorbing coating comprising: a substrate; an infrared reflective layer on the substrate; a barrier layer on the infrared reflective layer; an absorbing layer on the barrier layer, which is a composite absorbing layer; an antireflective layer on the absorbing layer.

Preferably, the absorbing layer comprises three absorbing sublayers, which are metal Cr, metal nitride $CrN_x$, and metal oxynitride $CrN_yO_z$, the value of x is between 0.9-1.5, the value of y is between 0-0.1, the value of z is about between 1.4-1.5.

Preferably, the thermal expansion coefficients of the three absorbing sublayers decreases in the order of metal, metal nitride, and metal oxynitride.

Preferably, the refractive index and extinction coefficient of the three absorbing sublayers decreases in the order of metal, metal nitride, and metal oxynitride, preferably, within the 500 nm-2500 nm wavelength range, the refractive index of Cr is 3.19-6.13, the refractive index of $CrN_x$ is 3.00-4.40, the refractive index of $CrN_yO_z$ is 2.38-2.20; Within the 380-2500 nm wavelength range, the extinction coefficient of Cr is 3.59-6.84, the extinction coefficient of $CrN_x$ is 1.79-0.76, the extinction coefficient of $CrN_yO_z$ is 0.47-0.05.

Preferably, a thickness of the composite absorbing layer is 80-140 nm, including metal absorbing sublayer with thickness of 10-30 nm, metal nitride sublayer with thickness of 30-50 nm, and metal oxynitride with thickness of 40-60 nm.

Preferably, the barrier layer comprises metal nitride $CrN_x$, wherein the value of x is between 0.9-1.5 and the barrier layer is optional.

Preferably, the thickness of the barrier layer is about 14-20 nm.

Preferably, the infrared reflective layer is made of a metal selected from a group consisting of Al, Cu, Au, Ag, Ni, and Cr, and metal Al is preferably selected.

Preferably, the thickness of the infrared reflective layer is 50-200 nm, preferably, 80-120 nm.

Preferably, the antireflective layer is a transparent dielectric material with the reflective index between 1.4 and 2.0.

Preferably, the antireflective layer is selected from a group consisting of $SiO_2$, $Al_2O_3$, $ThO_2$, $Dy_2O_3$, $Eu_2O_3$, $Gd_2O_3$, $Y_2O_3$, $La_2O_3$, MgO and $Sm_2O_3$, and $SiO_2$ is preferably selected.

The thickness of antireflective layer is between 50 nm and 150 nm, preferably, between 80 nm and 120 nm.

Preferably, the substrate is made of glass, aluminum, copper or stainless steel.

The invention relates to a method for forming the spectrally selective absorbing coating of claim 1 to 13, the method comprising: cleaning a substrate for coating; depositing an infrared reflective layer on the substrate; depositing a barrier layer on the infrared reflective layer; depositing an absorbing layer on the barrier layer, which is a composite absorbing layer; depositing an antireflective layer on the absorbing layer; the depositing methods include chemical vapor deposition and physical vapor deposition including evaporation, magnetron sputtering, preferably reactively magnetron sputtering the metal target in argon or other inert gas with some amounts of gas containing oxygen or nitrogen or their combinations is selected.

Details of the invention are described as following.

The substrate refers to any substrate to which a solar absorbing coating is provided, and it can be glass, aluminum, copper, or stainless steel, etc. The infrared reflective layer is preferably made of Al, but can also be made of Cu, Au, Ag, Ni, Cr or other metal with high electrical conductivity. The barrier layer is metal nitride $CrN_x$. The absorbing layer is a composite absorbing layer, including three absorbing sublayers, which are metal Cr, metal nitride $CrN_x$, and metal oxynitride $CrN_yO_z$. The AR layer is preferably made of $SiO_2$, but can also be made of other stoichiometric transparent dielectric film with refractive index in the range of 1.4-2.0, such as $Al_2O_3$, $ThO_2$, $Dy_2O_3$, $Eu_2O_3$, $Gd_2O_3$, $Y_2O_3$, $La_2O_3$, MgO, $Sm_2O_3$, $Si_3N_4$, etc. The thickness of the infrared reflective layer is 50 nm-200 nm, the thickness of the barrier layer is 5 nm-35 nm, the thickness of the metal Cr absorbing sublayer is 5 nm-40 nm, the thickness of metal nitride $CrN_x$ absorbing sublayer is 20 nm-60 nm, the thickness of metal oxynitride $CrN_yO_z$ absorbing sublayer is 30-70 nm. Thickness of the surface AR layer is 50 nm-150 nm.

To achieve the above objects, the following layers are coated in order on a glass, aluminum, copper or stainless steel substrate: infrared reflective layer (Cu, Au, Ag, Ni, Cr, etc., preferably Al), barrier layer ($CrN_x$), absorbing sublayer Cr, absorbing sublayer $CrN_x$, absorbing sublayer $CrN_yO_z$, stoichiometric transparent dielectric layer ($Al_2O_3$, $ThO_2$, $Dy_2O_3$, $Eu_2O_3$, $Gd_2O_3$, $Y_2O_3$, $La_2O_3$, MgO, $Sm_2O_3$, $Si_3N_4$, preferably $SiO_2$). The above infrared reflective layer, barrier layer, triple-layer composite absorbing layer, and AR layer can be coated by any suitable process so long as the layers can be properly formed, including magnetron sputtering, electron beam or thermal evaporation, ion plating, chemical vapor deposition, etc, preferably reactive magnetron sputtering.

Preferably, in the above mentioned fabrication process for spectrally selective solar absorbing coating, the thickness of the substrate is about 0.2-10 mm, the thickness of the infrared reflective layer is about 80-130 nm, the thickness of the barrier layer is about 14-20 nm, the thickness of the metal Cr absorbing sublayer is 10 nm-30 nm, the thickness of metal nitride $CrN_x$ absorbing sublayer is 30 nm-50 nm, the thickness of metal oxynitride $CrN_yO_z$ absorbing sublayer is 40-60 nm, the thickness of the surface AR layer is 80 nm-120 nm.

In the above mentioned fabrication process for spectrally selective solar absorbing coating, the composite absorbing coating consists of three absorbing sublayers, which are metal Cr, metal nitride $CrN_x$, and metal oxynitride $CrN_yO_z$, sandwiched between bottom IR reflective layer and top AR layer. Their thermal expansion coefficient decreases in the order of metal, metal nitride, and metal oxynitride. And their refractive index and extinction coefficient decreases in the order of metal, metal nitride, and metal oxynitride. Preferably, within the 500 nm-2500 nm wavelength range, the refractive index of Cr is 3.19-6.13, the refractive index of $CrN_x$ is 3.00-4.40, the refractive index of $CrN_yO_z$ is 2.38-2.20. Within the 380-2500 nm wavelength range, the extinction coefficient of Cr is 3.59-6.84, the extinction coefficient of $CrN_x$ is 1.79-0.76, the extinction coefficient of $CrN_yO_z$ is 0.47-0.05.

Preferably, in the above mentioned fabrication process for spectrally selective solar absorbing coating, the AR layer is $SiO_2$ dielectric layer. Within the 350 nm-2500 nm wavelength range, its refractive index is 1.43-1.47, and its extinction coefficient is below 0.03.

Embodiments of the present invention have the following characteristics:

The absorbing layer of the spectrally selective solar absorbing coating is a composite absorbing layer including three absorbing sublayers. The first absorbing sublayer is metal Cr. The second absorbing sublayer is metal nitride $CrN_x$, where a value of x is between 0.9-1.5. The third absorbing sublayer is metal oxynitride $CrN_yO_z$, where a value of y is between 0-0.1, a value of z is between 1.4-1.5.

The absorbing layer of the spectrally selective solar absorbing coating is a composite absorbing layer including three absorbing sublayers: metal Cr, metal nitride $CrN_x$ (x=0.9-1.5), and metal oxynitride $CrN_yO_z$ (y=0-0.1, z=1.4-1.5), and their refractive index and extinction coefficient decreases in the order of Cr, $CrN_x$, and $CrN_yO_z$. The values of $\alpha > 95\%$ and $\varepsilon \leq 4\%$ can be achieved based on their optical characteristics.

The second absorbing sublayer $CrN_x$(x=0.9-1.5) is almost transparent to the longer IR wavelengths, therefore, it does not re-radiate and has little impact on the thermal emissivity of the whole coatings. The second absorbing sublayer $CrN_x$ (x=0.9-1.5) is easily fabricated by reactive magnetron sputtering and its optical constants are not sensitive to the reactive atmosphere and almost unchangeable when the deposition is in a stoichiometrically fully nitrided mode. The metal nitride $CrN_x$(x=0.9-1.5) acting as the solar absorbing layer has the advantages of simple coating process, high process stability, low demand on the deposition equipment, etc, making it suitable for large-scale and low-cost production.

The third absorbing sublayer $CrN_yO_z$(y=0-0.1, z=1.4-1.5) is almost transparent to the longer IR wavelengths, therefore, it does not re-radiate and has little impact on the thermal emissivity of the whole coatings. The third absorbing sublayer $CrN_yO_z$(y=0-0.1, z=1.4-1.5) is easily fabricated by reactive magnetron sputtering and its optical constants are not sensitive to the reactive atmosphere and almost unchangeable when the ratio of gas flow rate $O_2/N_2$ is greater than a certain value corresponding to the reactive sputtering in which the oxidation reaction begins to become dominant. The metal oxynitride $CrN_yO_z$(y=0-0.1, z=1.4-1.5) acting as the solar absorbing layer has the advantages of simple coating process, high process stability, low demand on the deposition equipment, etc, making it suitable for large-scale and low-cost production.

The thicknesses of the layers are important for the overall optical characteristics of the multilayer absorbing coating. The present invention has the significant advantage that the range of thickness variation is quite wide for the optimized optical selectivity. The values of $\alpha > 95\%$ and $\varepsilon < 4\%$ can be achieved when the thickness of Cr in the range of 10-30 nm, the thickness of $CrN_x$ in the range of 30-50 nm, the thickness of $CrN_yO_z$ in the range of 40-60 nm.

The barrier layer of the spectrally selective solar absorbing coating is metal nitride $CrN_x$(x=0.9-1.5), which block the diffusion between infrared reflective layer and absorbing layer. When barrier layer $CrN_x$(x=0.9-1.5) is sandwiched between the infrared reflective layer Al and the first absorbing sublayer Cr, the top operating temperature of the coating increases from below 200° C. to more than 250° C. And at the same time, it has little impact on the solar absorptance and thermal emissivity of the whole coating.

The preferred metal Al acting as infrared reflective layer has higher refractive index and higher extinction coefficient in the entire wavelength range (solar light range and infrared radiation range) compared with metals like Au, Ag, Cu, etc; thus, while achieving low thermal emissivity, the preferred Al further enhances the solar absorptance of the absorbing coating.

The absorbing coating according to embodiments of the invention provides an absorbing coating with an excellent optical performance and a thermal and environmental stability. The optical properties can reach a value of $\alpha > 95\%$ and $\varepsilon \leq 4\%$ at temperature below 200° C., and the coating withstands the thermal cycles between a room temperature and application temperature (up to 250° C.) without loss of adherence and optical properties.

The above are general description of the embodiments; the preferred embodiment of infrared reflective layer (Al)—composite absorbing layer ($Cr/CrN_x/CrN_yO_z$)—antireflective layer ($SiO_2$) is described in more details below, and with reference to the drawings.

BRIEF DESCRIPTION OF THE DRAWINGS

FIG. 1 illustrates the spectral performance of an ideal selective solar absorbing coating and the irradiance of solar and blackbody of 100° C.-400° C.

FIG. 2 illustrates a sectional view of a spectrally selective solar absorbing coating in accordance with the present invention.

FIG. 3 illustrates an exemplary flowchart of a preparation method for the solar absorbing coating according to an embodiment of the invention.

FIG. 4 shows the measured absorbing spectra of the solar absorbing coating prepared in accordance with the present invention.

DETAILED DESCRIPTION OF THE PREFERRED EMBODIMENTS

To illustrate the technical schemes and effect of the present invention, the preferred embodiments of the spectrally selective solar absorbing coating and its manufacturing method, as well as testing results are described in detail below.

As shown in FIG. 2, the absorbing stack consists of, sequentially, a substrate 1, an infrared reflective layer 2, a barrier layer 3, an absorbing layer 4, and an antireflective layer 5. These layers are coated in sequence on a substrate 1 which ordinarily acts as a heat exchange medium.

The substrate 1 may be a piece of glass with a thickness of 0.5 mm-10 mm; it can also be some kind of metal such as copper, aluminum or stainless steel with a thickness of 0.2 mm-2 mm. Before coating, the substrate is cleaned by mechanical cleaning followed by RF (radio frequency) plasma cleaning, to remove various contaminants on the substrate surface.

The infrared reflective layer 2 is placed on the substrate. The function of the infrared reflective layer 2 is to reflect the incident light from ultraviolet to far infrared wavelength range, and more particularly infrared light above 2.5 μm. The infrared reflective layer 2 consists of aluminum and has a preferred thickness of 80-130 nm.

The barrier layer 3 is placed on the infrared reflective layer, and consists of $CrN_x$(x=0.9-1.5) with preferred thickness of 14-20 nm. The function of the barrier layer is to blocking the diffusion between infrared reflective layer and absorbing layer at higher operating temperature than 250° C.

The absorbing layer 4 is placed on the barrier layer. And it has a high absorptance in the solar spectrum range and nearly transparent in the infrared range. The absorbing layer in the present invention is a composite absorbing layer including three absorbing sublayers 4.1, 4.2, and 4.3 with successively decreased optical constants. The absorbing sublayer 4.1 consists of metal Cr; its refractive index is 3.19-6.13 (500 nm-2500 nm); its extinction coefficient is 3.59-6.84 (380 nm-2500 nm); the preferred thickness is 10 nm-30 nm. The absorbing sublayer 4.2 consists of mental nitride $CrN_x$ (x=0.9-1.5); its refractive index is 3.00-4.40 (500 nm-2500 nm); its extinction coefficient is 1.79-0.76 (380 nm-2500 nm); the preferred thickness is 30 nm-50 nm. The absorbing sublayer 4.3 consists of mental oxynitride $CrN_yO_z$ (y≈0.05, O≈1.45); its refractive index is 2.38-2.20 (500 nm-2500 nm); its extinction coefficient is 0.47-0.05 (380 nm-2500 nm); the preferred thickness is 40 nm-60 nm.

The AR layer 5 is placed on the composite absorbing layer, and consists of $SiO_2$. The function is to reduce the sunlight reflection at the interface between air and the absorbing coating, allowing more solar energy to enter the absorbing coating and then increasing the solar absorptance.

The preferred thickness of the $SiO_2$ AR layer is 80 nm-120 nm, and within the 380 nm-2500 nm wavelength range, its refractive index is 1.47-1.43 and its extinction coefficient is below 0.03.

Preparation Method

Embodiments of the present invention provide a preparation method for the above spectrally selective absorbing coating, which includes the following steps (as shown in FIG. 3).

Preparation of the substrate: Obtaining a polished metal plate or glass plate acting as substrate; applying mechanical cleaning (for example ultrasonic cleaning, brush cleaning, et al) followed by RF Ar plasma cleaning to remove contaminants on the substrate surface and ensure the sufficiently high cleanness level that are pre-requisite to deposit a uniform, reproducible coating.

Formation of the infrared reflective layer: Using (pulse) DC magnetron sputtering to deposit a metal infrared reflective layer on the surface of the above mentioned substrate. The sputtering target can be metal Al.

Formation of the barrier layer: Using (plus) DC magnetron sputtering to deposit a barrier layer on the surface of the above mentioned infrared reflective layer. The sputtering target can be metal Cr. The reactive gas is argon and nitrogen.

Formation of the composite absorbing layer: Using (pulse) DC magnetron sputtering to successively deposit metal, metal nitride, and metal oxynitride three absorbing sublayers on the surface of the above mentioned barrier layer. The sputtering target can be metal Cr. The reactive gas is argon for metal Cr, argon and nitrogen for metal nitride, argon, nitrogen and oxygen for metal oxynitride.

Formation of the antireflective layer: Using (pulse) DC reactive magnetron sputtering to deposit an antireflective layer on the surface of the above mentioned composite absorbing layer. The sputtering target can be semiconductor Si (doped Al:0-30 wt %). The reactive gas is argon and oxygen.

EXAMPLES

Specific examples illustrate certain embodiments of the invention are set out below.

Table 1 lists the thickness of various single layers of different selective absorbing coating samples formed by reactive magnetron sputtering based on the present invention.

TABLE 1

The thickness of all the single layers in different solar absorbing multilayer stacks

| sample | Al/nm | $CrN_x$/nm | Cr/nm | $CrN_x$/nm | $CrN_yO_z$/nm | $SiO_2$/nm |
|---|---|---|---|---|---|---|
| Example1 | 120 | 0 | 30 | 40 | 50 | 90 |
| Example2 | 120 | 15 | 30 | 40 | 50 | 90 |
| Example3 | 120 | 15 | 10 | 40 | 50 | 90 |
| Example4 | 120 | 15 | 20 | 40 | 50 | 90 |
| Example5 | 120 | 15 | 30 | 30 | 50 | 90 |
| Example6 | 120 | 15 | 30 | 35 | 50 | 90 |
| Example7 | 120 | 15 | 30 | 40 | 50 | 90 |
| Example8 | 120 | 15 | 30 | 45 | 50 | 90 |
| Example9 | 120 | 15 | 30 | 48 | 50 | 90 |
| Example10 | 120 | 15 | 30 | 50 | 50 | 90 |
| Example11 | 120 | 15 | 30 | 40 | 40 | 90 |
| Example12 | 120 | 15 | 30 | 40 | 45 | 90 |
| Example13 | 120 | 15 | 30 | 40 | 50 | 90 |
| Example14 | 120 | 15 | 30 | 40 | 55 | 90 |
| Example15 | 120 | 15 | 30 | 40 | 60 | 90 |

Example 1

The specific steps of the preparation process of the above example 1 on glass substrates are as following:

1) Cleaning of the glass pane: First, A glass pane was ultrasonically cleaned in a neutral detergent solution and thereafter rinsed in deionized water. Then, the glass pane was placed in the entrance chamber of the magnetron sputtering equipment and performed second cleaning step, using an RF plasma source to bombard the glass pane surface. The process parameters were as following: RF source sputtering power was 200 w, flow rate of working gas Ar (purity 99.99%), was 45 sccm, the working pressure was $9.8 \times 10^{-2}$ mTorr, and sputtering time was 360 s.

2) The cleaned glass substrate was passed from the entrance chamber to the sputtering chamber of the deposition equipment. The base pressure of the sputtering chamber was lower than $6 \times 10^{-6}$ Torr.

3) Forming the infrared reflective layer Al on the glass substrate: A metal Al target (purity 99.7%) was magnetron sputtered using plus DC power. The processing parameters were as follows: the sputtering power was 1200 w, the working pressure was 5 mTorr, the working gas Ar (purity 99.99%) flow rate was 5 sccm, the substrate moving speed was 0.8 m/min and the substrate was moved back and forth 5 times under the Al target, and the substrate temperature was room temperature.

4) Forming the composite absorbing layer on the Al/glass: A metal Cr target (purity 99.7%) was magnetron sputtered using pulse DC power to successively deposit Cr, $CrN_x$, and $CrN_yO_z$ on the surface of Al/glass.

a. The processing parameters of metal Cr absorbing sublayer were as follows: the sputtering power was 1500 w, the working pressure was 3 mTorr, the working gas Ar (purity 99.99%) flow rate was 50 sccm, the substrate moving speed was 2.3 m/min and the substrate was moved back and forth 3 times under the Cr target, and the substrate temperature was room temperature.

b. The processing parameters of metal nitride $CrN_x$ absorbing sublayer were as follows: the sputtering power was 1500 w, the working pressure was 3 mTorr, the working gas Ar (purity 99.99%) flow rate was 50 sccm, the working gas $N_2$ (purity 99.99%) flow rate was 50 sccm, the substrate moving speed was 1 m/min and the substrate was moved back and forth 3 times under the Cr target, and the substrate temperature was room temperature.

c. The processing parameters of metal nitride $CrN_yO_z$ absorbing sublayer were as follows: the sputtering power was 1500 w, the working pressure was 3 mTorr, the working gas Ar (purity 99.99%) flow rate was 50 sccm, the working gas $N_2$ (purity 99.99%) flow rate was 50 sccm, the working gas $O_2$ (purity 99.99%) flow rate was 10 sccm, the substrate moving speed was 0.45 m/min and the substrate was moved back and forth 5 times under the Cr target, and the substrate temperature was room temperature.

5) Forming the AR layer on the $CrN_yO_z/CrN_x/Cr/Al/glass$: A Si target (Al content 30 wt %, purity 99.7%) was magnetron sputtered using pulse DC power to deposit $SiO_2$ on the surface of $CrN_yO_z/CrN_x/Cr/Al/glass$. The processing parameters were as follows: the sputtering power was 2000 w, the working pressure was 5 mTorr, the gas flow rates were 30 sccm for Ar (purity 99.99%), 14 sccm for $O_2$ (purity 99.99%), the substrate moving speed was 1 m/min and the substrate was moved back and forth 9 times under the Si target, and the substrate temperature was room temperature.

6) After the above processing steps were completed, the coated sample were cooled for 20 min in the vacuum, and then removed out of the coating equipment.

7) The multilayered stack, example 1 was then heated in air at 250° C. for 200 hr.

Example 2

Example 2: The coating processing was same as that of the example 1, except of adding the barrier layer $CrN_x$ between IR reflective Al and absorbing sublayer metal Cr. The processing parameters of the barrier layer $CrN_x$ were as follows: the sputtering power was 1500 w, the working pressure was 3 mTorr, the working gas Ar (purity 99.99%) flow rate was 50 sccm, the working gas $N_2$ (purity 99.99%) flow rate was 50 sccm, the substrate moving speed was 2 m/min and the substrate was moved back and forth 3 times under the Cr target, and the substrate temperature was room temperature.

The multilayer stack, example 2 was then heated in air at 250° C. for 370 hr.

Example 3-15

The coating processing parameters were same as the above detailed description for example 1and example 2, except of the coating processing of the composite absorbing layer.

1) The substrate moving speed and the number of the passes were determined according to the thickness of the film being sputtered.

2) When coating $CrN_x$ layer, the flow rate of working gas $N_2$ was chosen randomly between 50 sccm and 100 sccm.

3) When coating $CrN_yO_z$ layer, the flow rate of working gas $O_2$ was chosen randomly between 10 sccm and 50 sccm.

For the examples in the present embodiment of the invention, the 0.3-2.5 μm reflective spectra were measured using a spectrophotometer at room temperature, which can be used to calculated the absorbing spectra in accordance to spectral absorptance α being expressed in terms of total reflectance ρ for opaque materials, α=100−ρ(%). The solar absorptance was obtained by numerical integration of the above absorbing curves over the solar distribution curve referenced as 1.5 AM in FIG. 1.

Thermal emissivity was firstly measured at 100° C., by means of an emissometer, which performs a complete measurement in the range of 3-30 μm, the uncertainty of which is ±0.01. Secondly, the optical reflectance was characterized in the infrared range from 2 μm to 48 μm, which makes it possible to estimate the thermal emissivity at any temperature based on said reflectance and the emission curve of an ideal black body emitter at said working temperature. The service lifetime within at 10-20 years of low-temperature absorber can be described by a PC value (PC=−Δα+0.25Δε<5%), which was obtained by exposing the absorbing coating for 200 hr at 250° C.

FIG. 4 shows the absorbing spectra of the example 1 and example 2. Their solar absorptance, thermal emissivity (100° C., 250° C.) before and after the heating treatment and corresponding PC values are given in Table 2. It is shown that example 1, showing in FIG. 4 as a solar absorbing coating according without a barrier layer, provides a thermal and environmental stability for multilayer coatings with a good optical performance required for low-temperature application under 200° C. The optical properties can reach a value of α>95%, and a value of ε<4% (100° C.), PC value of 1.0% when heated in air at 250° C. for 200 hr. Example 2, showing in FIG. 4 as absorbing coating with barrier layer, provides a thermal and environmental stability for multilayer coatings with an excellent optical performance required below 250° C. The optical properties can reach a value of α>95%, and a value of ε~4%(100° C.), 6-7%(250° C.), PC value of −0.3% when heated in air at 250° C. for 370 hr.

TABLE 2

The solar absorptance, thermal emissivity of example 1 and 2 before and after the heating treatmen

| | | Solar absorptance | Thermal emissivity ε (%) | |
| --- | --- | --- | --- | --- |
| example | Heat treatment | α (%) | ε(100° C.) | ε(250° C.) |
| 1 | \ | 95.9 | 3.8 | 6.2 |
| | 250° C. (120 hr) | 96.3 | 6.6 | 10.6 |
| | PC value (120 hr) | | 0.3 | 0.7 |
| | PC value (200 hr) | | 1.0 | |
| 2 | \ | 95.4 | 4.1 | 6.6 |
| | 250° C. (370 hr) | 95.7 | 4.1 | 6.4 |
| | PC value (370 hr) | | −0.3 | −0.35 |

For the example 3-15, the solar absorptance was found to be more than 95%, thermal emissivity (100° C.) was lower than 5%. Combining with their coating parameters, it is clear that their optical selectivity was not influenced by the fluctuation of the working gas flow rate, especially in the coating process of metal oxynitride and metal nitride absorbing sublayers.

Moreover, the thickness range for the optimized optical properties was quite wide, for example, the thickness of Cr absorbing sublayer was 10-30 nm, the thickness of $CrN_x$ absorbing sublayer was 30-50 nm, the thickness of $CrN_yO_z$ was 40-60 nm.

The invention claimed is:

1. A spectrally selective solar absorbing coating comprising:
   a substrate;
   an infrared reflective layer on the substrate;
   a barrier layer on the infrared reflective layer;
   an absorbing layer on the barrier layer, which is a composite absorbing layer;
   an antireflective layer on the absorbing layer,
   wherein the absorbing layer comprises three absorbing sublayers, which are metal Cr, metal nitride $CrN_x$, and metal oxynitride $CrN_yO_z$, the value of x is between 0.9-1.5, a value of y is between 0-0.1, a value of z is about between 1.4-1.5,
   the thermal expansion coefficients decrease in the order of metal, metal nitride, and metal oxynitride.

2. The spectrally selective solar absorbing coating of claim 1, wherein the refractive index and extinction coefficient decreases in the order of metal, metal nitride, and metal oxynitride.

3. The spectrally selective solar absorbing coating of claim 1, wherein a thickness of the composite absorbing layer is 80-140 nm, including metal absorbing sublayer with thickness of 10-30 nm, metal nitride sublayer with thickness of 30-50 nm, and metal oxynitride with thickness of 40-60 nm.

4. The spectrally selective solar absorbing coating of claim 1, wherein the barrier layer comprises metal nitride $CrN_x$, wherein a value of x is between 0.9-1.5.

5. The spectrally selective solar absorbing coating of claim 1, wherein the thickness of the barrier layer is about 14-20 nm.

6. The spectrally selective solar absorbing coating of claim 1, wherein the infrared reflective layer is made of a metal selected from a group consisting of Al, Cu, Au, Ag, Ni, and Cr.

7. The spectrally selective solar absorbing coating of claim 6, wherein the thickness of the infrared reflective layer is 50-200 nm.

8. The spectrally selective solar absorbing coating of claim 1, wherein the antireflective layer is a transparent dielectric material with the reflective index between 1.4 and 2.0.

9. The spectrally selective solar absorbing coating of claim 8, wherein the antireflective layer is selected from a group consisting of $SiO_2$, $Al_2O_3$, $ThO_2$, $Dy_2O_3$, $Eu_2O_3$, $Gd_2O_3$, $Y_2O_3$, $La_2O_3$, MgO and $Sm_2O_3$.

10. The spectrally selective solar absorbing coating of claim 8, wherein the thickness of antireflective layer is between 50 nm and 150 nm.

11. The spectrally selective solar absorbing coating of claim 1, wherein the substrate is made of glass, aluminum, copper or stainless steel.

12. A method for forming the spectrally selective absorbing coating of claim 1, the method comprising: cleaning a substrate for coating; depositing an infrared reflective layer on the substrate; depositing a barrier layer on the infrared reflective layer; depositing an absorbing layer on the barrier layer, which is a composite absorbing layer; depositing an antireflective layer on the absorbing layer; wherein the depositing methods include chemical vapor deposition and physical vapor deposition including evaporation, magnetron sputtering, and wherein the absorbing layer comprises three absorbing sublayers, which are metal Cr, metal nitride $CrN_x$, and metal oxynitride $CrN_yO_z$, the value of x is between 0.9-1.5, a value of y is between 0-0.1, a value of z is about between 1.4-1.5, and the thermal expansion coefficients decrease in the order of metal, metal nitride, and metal oxynitride.

13. The spectrally selective solar absorbing coating of claim 2, wherein within the 500 nm-2500 nm wavelength range, the refractive index of Cr is 3.19-6.13, the refractive index of $CrN_x$ is 3.00-4.40, the refractive index of $CrN_yO_z$ is 2.38-2.20; and within the 380-2500 nm wavelength range, the extinction coefficient of Cr is 3.59-6.84, the extinction coefficient of $CrN_x$ is 1.79-0.76, the extinction coefficient of $CrN_yO_z$ is 0.47-0.05.

14. The spectrally selective solar absorbing coating of claim 6, wherein the infrared reflective layer is made of Al.

15. The spectrally selective solar absorbing coating of claim 7, wherein the thickness of the infrared reflective layer is 80-120 nm.

16. The spectrally selective solar absorbing coating of claim 9, wherein the antireflective layer is $SiO_2$.

17. The spectrally selective solar absorbing coating of claim 10, wherein the thickness of antireflective layer is between 80 nm and 120 nm.

18. The method for forming the spectrally selective absorbing coating of claim 12, wherein reactively magnetron sputtering the metal target in argon or other inert gas with some amounts of gas containing oxygen or nitrogen or their combinations is selected.

* * * * *